(12) United States Patent
Yang et al.

(10) Patent No.: US 7,052,373 B1
(45) Date of Patent: May 30, 2006

(54) SYSTEMS AND SLURRIES FOR CHEMICAL MECHANICAL POLISHING

(75) Inventors: Andy Chunxiao Yang, Shanghai (CN); Chris Chang Yu, Shanghai (CN)

(73) Assignee: ANJI Microelectronics Co., Ltd., Grand Cayman (KR)

( * ) Notice: Subject to any disclaimer, the term of this patent is extended or adjusted under 35 U.S.C. 154(b) by 0 days.

(21) Appl. No.: 11/038,514

(22) Filed: Jan. 19, 2005

(51) Int. Cl.
*B24B 1/00* (2006.01)

(52) U.S. Cl. ............... 451/41; 451/57; 451/65; 451/285; 438/690; 51/307

(58) Field of Classification Search ............. 451/41, 451/57, 65, 285–290; 51/307–309; 438/690–694
See application file for complete search history.

(56) References Cited

U.S. PATENT DOCUMENTS

| | | | |
|---|---|---|---|
| 5,916,855 A * | 6/1999 | Avanzino et al. ......... 51/307 |
| 6,235,636 B1 | 5/2001 | Ng et al. | |
| 6,251,788 B1 | 6/2001 | Liou | |
| 6,358,853 B1 | 3/2002 | Cadien et al. | |
| 6,361,402 B1 | 3/2002 | Canaperi et al. | |
| 6,464,740 B1 | 10/2002 | Towery et al. | |
| 6,638,328 B1 * | 10/2003 | Lee et al. ............. 51/309 |
| 6,663,472 B1 * | 12/2003 | Lim et al. ............. 451/57 |
| 6,723,143 B1 | 4/2004 | Towery et al. | |
| 2003/0132420 A1 * | 7/2003 | Yadav et al. ........... 252/79.1 |
| 2004/0192172 A1 * | 9/2004 | Towery et al. ........... 451/41 |

* cited by examiner

*Primary Examiner*—Lee D. Wilson
*Assistant Examiner*—Anthony Ojini
(74) *Attorney, Agent, or Firm*—Tran & Associates

(57) ABSTRACT

Systems and methods are disclosed for polishing a semiconductor substrate having a polymer film surface deposited thereon by chemishearing the surface; and performing chemical mechanical polishing (CMP) on the chemisheared surface.

20 Claims, 1 Drawing Sheet

SYSTEMS AND SLURRIES FOR CHEMICAL MECHANICAL POLISHING

BACKGROUND

The invention relates to systems and slurries for polishing semiconductor substrates.

To meet the needs for larger scale integration, which demands more metal and dielectric layers in devices, the surface topography of the substrate must exhibit exact depth of focus for sub-micron lithography. As discussed in U.S. Pat. No. 6,663,472, chemical mechanical polishing (CMP) is typically used for polishing materials, such as semiconductor substrates and precision optical components, to a high degree of planarity and uniformity. The process is used to initially planarize semiconductor substrate and is also used to remove uneven topography created during the forming of the sub-micron circuitry on the substrate. Where the substrate is to be further processed, such as by photolithography and etching, to create integrated circuit structures, any thickness variation in the planarized layer makes it difficult to meet the fine resolution tolerances required to provide high yield of functional die on a substrate. CMP is typically used in planarizing interlayer insulating films and in shallow-trench separation, because it can completely (both globally and locally) planarize layers to be exposed, reducing the burden on exposure techniques and stabilizing the production yield.

Another application of CMP is to form metal features inlaid in a dielectric layer (in some cases, it is also called damascene), in which CMP is utilized as a method of patterning. In the above mentioned patterning process, trenches are first etched into the dielectric layer, metal layer is next deposited, and finally excess metal is removed using CMP, leaving metal features co-planar with the dielectric layer surface.

A conventional CMP process involves supporting and holding the substrate against a rotating polishing pad that is wetted with polishing slurry and at the same time applying a pressure against the rotating pad. The pH of the polishing slurry controls the chemical reaction, for example, the oxidation of the chemicals that make up the insulating layer of the substrate. The polishing pad is typically made from non-fibrous polyurethane or a polyester-based material. The pad hardness is typically about between 50 and 70 durometers. Polishing pads used with semiconductors are commercially available in a woven polyurethane material. The polishing slurry, which typically includes an abrasive material, is maintained on the polishing pad to modify the polishing characteristics of the pad in order to enhance the polishing and planarization of the substrate.

The CMP polishing action is typically aided by a slurry which includes for example, small abrasive particles such as silica ($SiO_2$) or alumina ($Al_2O_3$) that abrasively act to remove a portion of the material on the surface being polished. Additionally, the slurry may include chemicals that react with the process surface to assist in removing a portion of the surface material, the slurry typically being separately introduced between the wafer surface and the polishing pad. During the polishing or planarization process, the wafer is typically pressed against a rotating polishing pad. In addition, the wafer may also rotate and oscillate back and forth over the surface of the polishing pad to improve polishing effectiveness.

As discussed in U.S. Pat. No. 6,638,328, typical CMP polishing slurries contain an abrasive material, such as silica or alumina, suspended in an oxidizing, aqueous medium. There are various mechanisms disclosed in the prior art by which metal surfaces can be polished with slurries. The metal surface may be polished using a slurry where a surface film is not formed causing the process to proceed by mechanical removal of metal particles. In using this method, the chemical dissolution rate should be slow in order to avoid wet etching. A more preferred mechanism continuously forms a thin, soft, and abradable layer through a reaction between the metal surface and one or more components in the slurry such as a complexing agent and/or a film forming layer such as an oxidizer. The thin abradable layer is then removed in a controlled manner by mechanical action. In competing with mechanical action, a thin passive film is formed on the surface and controls the wet etching process. Controlling the chemical mechanical polishing process can be easier with this approach. There are also several different types of slurries used in the CMP process. Common abrasives include silica ($SiO_2$), alumina ($Al_2O_3$), ceria ($CeO_2$), titania ($TiO_2$), and zirconia ($ZrO_2$).

Polymers serving as the photo resist, passivation material, and low k ILD materials, among others, have been widely used for manufacturing various IC devices such as DRAM, SRAM, MEMS, imaging devices and CPU, among others. Increasingly, to enhance performance, a thinner and/or a more planar polymer film is desired. As device feature size continues to shrink, planarity requirements become increasingly stringent and such polymer materials need to be planarized. While chemical mechanical polishing (CMP) is a viable planarization method for IC devices, there have been no CMP slurries developed specifically for polymer CMP. Using un-optimized CMP slurries for polymer polishing can result in many issues. For example, on occasions, the polymer is not cured completely to get a high RR of polishing using conventional oxide slurry. This method causes at least two drawbacks, one is the difficulty in CMP process control, for (1) the softness of the film is sensitive to even minor curing variations; (2) it is hard to get a proper polishing stop for the soft film if only mechanical polishing is used; and (3) mechanical polishing results in higher non-uniformity, scratch and residue. Another drawback is after polishing, the film needs to be cured for a second time, which lowers the throughput and is not cost effective.

On occasions, the polymer surface has been treated with $N_2O$ or $O_2$ plasma before the polishing so that a desirable removal rate and stop layer can be obtained. However, this solution is slow and not cost effective. Moreover, the defect issue can also be increased because the process uses oxide slurry rather than slurry designed specifically for the polymer film. In addition, because both the polymer film and the polishing pad are hydrophobic, during the polishing, wafer dropping can increase due to the friction between the polymer film surface and the polishing pad.

SUMMARY

Novel systems and methods are disclosed for polishing a semiconductor substrate having a polymer film surface deposited thereon by chemishearing the surface; and performing chemical mechanical polishing (CMP) on the chemisheared surface.

The chemishearing facilitates making the top polymer surface stiff, fragile or chapped and weaking or breaking bonds of polymer layer at top surface, through which the removal rate and the planarization rate of the polymer film in a CMP process can be increased and the defectivity can be reduced.

Implementations of the above novel aspect can include one of the following. The chemishearing the surface can break bonds at top polymer layer and making the surface stiff, fragile or chapped on a microscopic scale. A polymer CMP slurry can be applied to the system. The chemishearing the surface can include one of the following: oxidizing, catalyzing, and local pyrogenating the surface. The CMP slurry can be an oxidation abrasive. The oxidation abrasive can be one of: $ZrO_2$, $Al_2O_3$, CaO, $Fe_2O_3$, MgO, and a particle with an oxidation adding particle to the polymer including treated particles, or particle coated with —O—O— compound. The chemishearinging the surface can include micro-cracking the surface. The CMP slurry can be a catalyst containing an abrasive such as Fe, Mn or Cu. The CMP slurry can include multiple abrasives. The abrasives can include $Fe_2O_3$, Al or catalyst. The CMP slurry can include a pH tuning agent such as HCl, $H_2SO_4$ $H_3PO_4$ Citric acid, $NH_4OH$, $HNO_3$, NaOH, KOH or an inorganic and organic acid and base. A surfactant can be added to the slurry. The surfactant can be one of: polyethylene glycol, polyoxyethylene ether, glycerol, polypropylene glycol, polyvinylalcohol, polyacrylic acid, polymethyl acrylic acid, acrylic acid-axylate copolymer), acrlic acid-hydroxypropyl acrylate copolymer, acrylic acrylate copolymer copolymer of maleic acid and acrylic acid, acrylic acid-hydroxypropyl acrylate ternary polymer, BOF, polyvinyl alcohol modified by copolymerization, . copolymer of alkanolalkyl methacrylate with alkanolamine, maleic-styrene copolymer and polyethylene glycol mono methyl copolymer, carboxylic acid modified polyvinylalcohol, derivative of copolymer of ethylene glycol and polyamine, specific copolymer dispersant, hydroxy propyl acrylat and any other copolymer of monomers, isobutene, propylene oxide, 2-hydroxyethyl, methyl acrylate, maleic anhydride, acrylic acid, methacrylic acid acrylamide methyl acrylamide styrene, and vinyl pyridine ketone, 1,2,3 benzotriazole (BTA), Indene, Benzofuran (coumarone), thionahpithene, 1-benzazole, 4-isobenzazole, indolenine or pseudoisoindole, isoindzzole, indazole, benzimidazole, indiazole, 1-pyrido[2,3-d]-v-triazole, 1-pyrazolo pyrazine,2-v-triazolo[b]pyrazine, 1,2-benzeisoxzoble, benzopseudoxazole, benzofurazan, or purine. The CMP slurry can include an oxidize such as: —O—O— containing compounds, $H_2O_2$, salt of $S_2O_4^{2-}$ or $S_2O_8^{2-}$, $KIO_3$, $Fe(NO_3)_2$, $KMnO_4$, $KNO_3$ $HNO_3$, bromate, Bromine, Butadiene, Chlorates, Chloric acid, Chlorine, Chlorites, Chromates, Chromic Acid, Dichromates, Fluorine, haloates, Halogens, hypochlorites, Nitrous oxide, Ozanates, oxides, oxygen, oxygen difluoride ozone, peracetic acid perborates, perhaloate, percarbonates, perchlorates, perchloric acid, perhydrates, peroxides, persulfates, permanganates, sodium borate or sulfuric acid. The CMP slurry can include an enzyme. The CMP process can have the following parameters:

Removal rate: 2000–5000 A/min.

Down force: no less than 1 psi

Turntable rotation speed: no less than 50 rpm.

Head speed no less than 30 rpm.

Conditioner: in situ or ex situ.

Pad: polyurethane pad

Other advantages may include one or more of the following. The slurry enables CMP to be a stable process for volume production. The novel CMP slurries include the following advantages: desired removal rate, less or no dishing, less or no defect issue (such as scratch), no corrosion issue, and reasonable cost of ownership (CoO). The slurries disclosed herein can be applied to the manufacturing of any products, including but not limited to logic devices (such as microprocessor), memory products (DRAM, SRAM, FLASH, EEPROM, MRAM, FeDRAM, etc.), MEMS, MOMS, LCOS, CIS, and so on. Moreover, by using the slurries, a highly planar and highly reflective film surface can be obtained. The slurries can be used to form interconnects and mirror patterns useful for IC fabrication of circuits including imaging and other device applications.

The novel polymer CMP slurry can quickly or finely polish a surface-without making defects and flaws. Further, the CMP abrasive does not contaminate the surface to be polished. Moreover, the CMP slurry and systems and methods disclosed improve the flatness of the polished surface of a substrate.

These and other embodiments, aspects and features of the invention will be better understood from a detailed description of the preferred embodiments of the invention which are further described below in conjunction with the accompanying figures.

BRIEF DESCRIPTION OF THE DRAWINGS

The present invention can be more fully understood by reading the subsequent detailed description in conjunction with the examples and references made to the accompanying drawings, wherein.

DESCRIPTION

Figure 1:
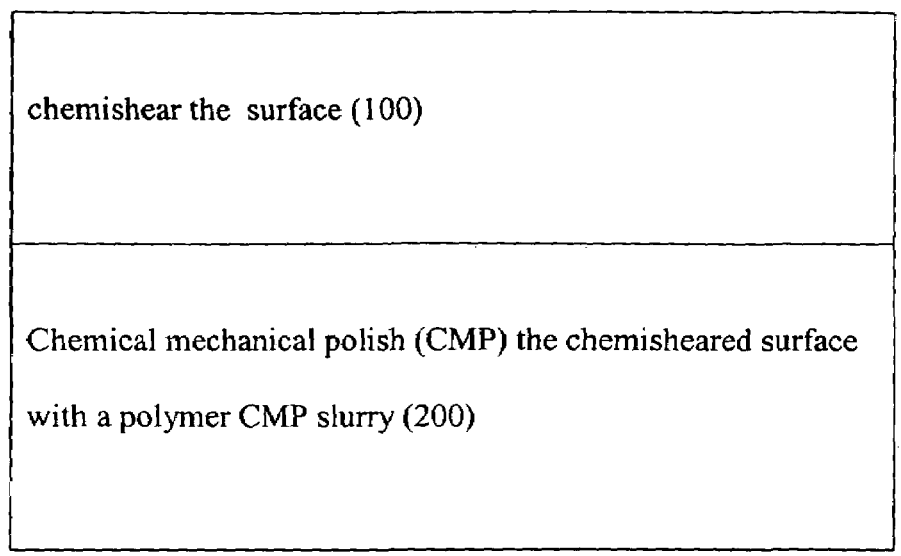
FIG. 1 shows an exemplary process for polishing a wafer.

There will now be described in detail with reference to the drawings some preferred embodiments of the present invention applied to a CMP tool for planarizing and forming finely finished surface on the semiconductor substrate. In the following description of the preferred embodiments, the same reference numerals as those in the prior figures denote similar parts for convenience of illustration.

FIG. 1 shows an exemplary process for semiconductor fabrication. The process first chemishears the surface of a polymer on a semiconductor wafer (100). Next, the process performs chemical mechanical polishing (CMP) on the chemisheared surface with polymer CMP slurry (200). Details of the process of FIG. 1 are discussed below.

The polymer used in the IC manufacturing can be divided into two groups according to the film hardness. One type is soft polymer, such as benzocyclobutene, BCB, parylene-n and fluorinated polyimide, which have high removal rate given they were abraded mechanically only. Another type of polymer is hard polymer, for example, poly(arylene) ether, HSQ(Hydrogen silsesquioxane), MSQ(methyl silsesquioxane) among others, which is hard to remove given they were abraded mechanically only.

In one implementation of operation 100, the polymer film surface (approximately <500 Å thickness from top of surface) is chemisheared by many factors, such as oxidation, catalyzing, local pyrogenation, among others, so that the surface becomes stiff, fragile and chapped on a microscopic scale, which is easier to react with mechanical CMP operation.

In another implementation, under the mechanical action and, to a less extent, surface chemical reaction, microcracking and subsequent chemical solution diffusion into the sub-surface can be caused to occur at the surface being polished. The result is an enhanced surface chemical reaction and accelerated removal rate.

The chemishearing enables the polymer surface to be more resistant to deformation under the pressure of a polishing pad so that higher regions of the polymer film are polished first or polished at a faster pace than lower regions of the polymer film, resulting in excellent planarization. Further, with the aid of the surfactant passivation, better planarization performance can be obtained. The polymer particles or residues from the polishing are dispersed into the solution by surfactant and carried away with the slurry flow. For a soft polymer film, hardening or passivation agent can be added into the slurry to make the polymer film surface robust to the mechanical action. Since non-mechanical operations of the CMP operate without mechanical stress, lower defectivity can be achieved at the polymer surface.

In a CMP system, abrasive operations on the polymer surface apply more force than the mechanical polishing because the polymer is a ductile film and thus reliance on mechanical operations results in plowing and wrinkle type scratches. Moreover, it is also possible to leave large polymer residues on the substrate. To avoid these issues, three kinds of abrasives are used:

a. Oxidation Type Abrasive

This type of abrasive has an oxidizing ability. When the slurry hits the surface of polymer under the polishing pad press, oxidation occurs on the surface of the polymer film at the same time which changes the film local hardness and causes the surface of the polymer to depolymerized. Under a chemical and mechanical co-effect, the polymer film is then abraded and removed. The oxidation abrasive can be selected from $ZrO_2$, $Al_2O_3$, CaO, $Fe_2O_3$, MgO, etc., and any other particles presenting the oxidation ability to the polymer including treated particles.

b. Catalyst Containing Abrasive

This type of abrasive contains the catalyst or special enzyme which can accelerate the chemishearing of the polymer surface. For example, Fe, Mn, or Cu can be added into the abrasive to serve as the polymer oxidation catalyst.

c. Multiple Abrasives

This type of abrasive contains a plurality of abrasives. The multiple abrasives in slurry serve two functions: one is to promote the polymer film surface's chemishearing, and the other is to prevent the pad surface from being chemisheared. The promotion function of chemishearing can be realized by adding two or more types of particles contained in separate dispensers. During the polishing, when different particles are mixed, they react with each other and release heat (for example, Fe2O3, Al and catalyst) or/and chemical such as —O—O— containing compounds, $O_2$ and $O_3$ etc which accelerates the polymer film's chemishearing. To prevent the pad from being chemisheared, another kind of particle (or surfactant) which is inert to any other particles in slurries can be added. The abrasive particles which promote film chemishearing have the properties of easily adsorbing onto the polymer film surface rather than the pad surface, and the inert particle should have the properties of the easily adsorbing onto the pad surface, which can be realized in one embodiment using the surfactant or optimizing iso-electric points of particles and pH value of the solution.

In one implementation, the content of the abrasive in the slurries range from 0.1–10 weight percent, with 0.5–2% being preferred. And the abrasive's iso-electro point is preferably not the same as or close to that of the polymer surface. By tuning the solution's pH value, abrasives attached on the polymer surface due to the electrostatic attraction can be easily removed.

In addition to the above types of abrasives, polymer abrasives can also be used for polishing polymer materials.

Generally acid or base is selected to favor the chemishearing of the polymer. So according to the detailed polymer, the pH tuning agent is selected to maintain a acid or base solution condition. For example, for polyimide, pH is 11 preferred. The pH tuning agent can be selected from a group of HCl, H2SO4 H3PO4 Citric acid, NH4OH, HNO3, NaOH, KOH or any other inorganic and organic acid and base.

3. Surfactant

Surfactants can be added into the slurry for four functions. One is to act as the abrasive dispersion agent. The second is to act as a passivation layer for the soft polymer surface or the polishing pad surface to control the mechanical reaction to the surface, and the third is to change the polymer surface's charge status. The fourth function is to change the wettability of the polymer film to eliminate the friction between the polishing pad and the polymer film. Thus the wafer dropping issue during the polishing can be avoided. The surfactant can be selected from but not limited to a group consisting of polyethylene glycol, polyoxyethylene ether, glycerol, polypropylene glycol, polyvinylalcohol, polyacrylic acid, polymethyl acrylic acid, acrylic acid-axylate copolymer), acrlic acid-hydroxypropyl acrylate copolymer, acrylic acrylate copolymer copolymer of maleic acid and acrylic acid, acrylic acid-hydroxypropyl acrylate ternary polymer, BOF, polyvinyl alcohol modified by copolymerization, . copolymer of alkanolalkyl methacrylate with alkanolamine, maleic-styrene copolymer and polyethylene glycol mono methyl copolymer, carboxylic acid modified polyvinylalcohol, derivative of copolymer of ethylene glycol and polyamine, specific copolymer dispersant, hydroxy propyl acrylat and any other copolymer of monomers, isobutene, propylene oxide, 2-hydroxyethyl, methyl acrylate, maleic anhydride, acrylic acid, methacrylic acid acrylamide methyl acrylamide styrene, and vinyl pyridine ketone, 1,2,3-benzotriazole(BTA),Indene,Benzofuran(coumarone),thionahpithene, 1-benzazole, 4-isobenzazole, indolenine or pseudoisoindole, isoindzzole, indazole, benzimidazole, indiazole, 1-pyrido[2,3-d]-v-triazole, 1-pyrazolo pyrazine,2-v-triazolo[b]pyrazine, 1,2-benzeisoxzoble.benzopseudoxazole, benzofurazan, and purine.

The oxidizer used in the slurries enhances the polymer film surface's oxidation or chemishearing so that a good removal rate can be obtained and the oxidation can also help to change the wet and charge status of the polymer film. The oxidizer agent can be selected from but not limited to a group consisting of H2O2, salt of S2O42- or S2O82-, KIO3, Fe(No3)2, KMnO4, KNO3 HNO3, bromate, Bromine, Butadiene, Chlorates, Chloric acid, Chlorine, Chlorites, Chromates, Chromic Acid, Dichromates, Fluorine, haloates, Halogens, hypochlorites, Nitrous oxide, Ozanates, oxides, oxygen, oxygen difluoride ozone, peracetic acid perborates, perhaloate, percarbonates, perchlorates, perchloric acid, perhydrates, peroxides, persulfates, permanganates, sodium borate and sulfuric acid.

Other additives can also be used. For example, enzyme can be used. Because the chemishearing of polymer promoted by the enzyme has highly specificity, the utilization of enzymes in polymer's CMP can avoid the pad surface damage.

Exemplary process parameters for the polymer polishing can be as follows:

Removal rate: 2000–5000 A/min.
Down force: no less than 1 psi
Turntable rotation speed: no less than 50 rpm.
Head speed no less than 30 rpm.
Conditioner: needed, in situ or ex situ.
Pad: polyurethane pad The CMP system can have a fixed slurry delivery system or can have a computer controlled slurry delivery system. The computer controlled slurry flow system decides the optimal flow rate of the slurry and the optimal distance between a slurry injector and a polish head in order to get the maximum value of the removal rate of the CMP process. The slurry flow system controls the flow rate of the slurry that is dispensed on a polish pad and the distance between a slurry injector and a polish head to optimize the flow of the slurry on the polish pad. The rotational speed of the polish pad and the polish head, the pressure on the polish head and the pressure on the wafer under the polish head are controlled for maintaining the process parameters of a CMP process. In one implementation, the system includes a current detector that senses a motor current for driving a turntable of the CMP system and the turn table is adapted for rotating the polish pad of the CMP system. The system changes the flow rate of the slurry and the position of the slurry injector, thus changing the distance between the injector and the polish head, until the current reaches a minimum value.

Figure 2:
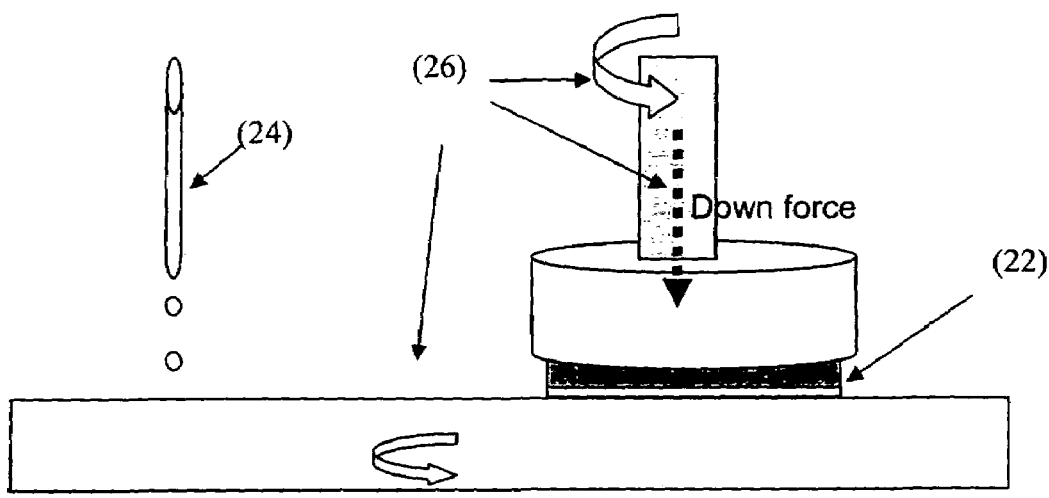
FIG. 2 shows an exemplary system for polishing a wafer.

As shown in FIG. 2, the polishing of the wafer with the polymer film includes positioning the surface on a polishing pad (22); supplying polishing slurry on the pad (24); and rotating and pressing the wafer and the pad at the same time (26). Subsequently, the residue on the wafer can be removed. The CMP process can include: positioning the surface of a wafer under a polishing pad; supplying the CMP slurry onto the polishing pad; rotating the wafer and the polishing pad with certain speeds, respectively and at the same time, pressing the wafer toward the pad with a certain down force. During or after the polishing, the pad condition is applied to remove the polishing residue. In addition, the polished wafer is cleaned in a desired cleaning solution to remove polishing residue.

While the invention has been described by way of example and in terms of the above, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for polishing a semiconductor substrate having a polymer film surface deposited thereon, comprising:
    chemishearing the surface; and
    performing chemical mechanical polishing (CMP) on the chemisheared surface, wherein the CMP slurry comprises an oxidation abrasive including one of: ZrO2, Al2O3, CaO, Fe2O3, MgO, and a particle with an oxidation adding particle to the polymer including one of: a treated particle and a particle coated with an —O—O— compound.

2. The method of claim 1, wherein chemishearing the surface further comprises breaking bonds at a top polymer layer.

3. The method of claim 1, wherein chemishearing the surface comprises one of: oxidizing, catalyzing, and local pyrogenating the surface.

4. The method of claim 1, comprising applying a polymer CMP slurry.

5. The method of claim 4, wherein the CMP slurry comprises a catalyst containing abrasive.

6. The method of claim 5, wherein the catalyst containing abrasive comprises one of: Fe, Mn and Cu.

7. The method of claim 4, wherein the CMP slurry comprises multiple abrasives.

8. The method of claim 7, wherein the abrasives comprise one of: $Fe_2O_3$, Al and catalyst.

9. The method of claim 4, wherein the CMP slurry comprises a pH tuning agent.

10. The method of claim 9 wherein the tuning agent comprises one of: HCl, $H_2SO_4$ $H_3PO_4$ Citric acid, $NH_4OH$, $HNO_3$, NaOH, KOH and an inorganic and organic acid and base.

11. The method of claim 4, comprising providing a surfactant to the slurry.

12. The method of claim 11 wherein the surfactant comprises one of: polyethylene glycol, polyoxyethylene ether, glycerol, polypropylene glycol, polyvinylalcohol, polyacrylic acid, polymethyl acrylic acid, acrylic acid-axylate copolymer), acrlic acid-hydroxypropyl acrylate copolymer, acrylic acrylate copolymer copolymer of maleic acid and acrylic acid, acrylic acid-hydroxypropyl acrylate ternary polymer, BOF, polyvinyl alcohol modified by copolymerization, . copolymer of alkanolalkyl methacrylate with alkanolamine, maleic-styrene copolymer and polyethylene glycol mono methyl copolymer carboxylic acid modified polyvinylalcohol, derivative of copolymer of ethylene glycol and polyamine, specific copolymer dispersant, hydroxy propyl acrylat and any other copolymer of monomers, isobutene propylene oxide, 2-hydroxyethyl, methyl acrylate, maleic anhydride, acrylic acid, methacrylic acid acrylamide methyl acrylamide styrene, and vinyl pyridine ketone, 1,2,3 benzotriazole (BTA), Indene, Benzofuran (coumarone), thionahpithene,1-benzazole,4-isobenzazole, indolenine or pseudoisoindole, isoindzzole, indazole, benzimidazole, indiazole, 1-pyrido[2,3-d]-v-triazole, 1-pyrazolo pyrazine,2-v-triazolo[b]pyrazine, 1,2-benzeisoxzoble, benzopseudoxazole, benzofurazan, and purine.

13. The method of claim 4, wherein the CMP slurry comprises an oxidizer.

14. The method of claim 13, wherein the oxidizer comprises one of: —O—O— containing compounds, $H_2O_2$, salt of $S_2O_4^{2-}$ or $S_2O_8^{2-}$; $KIO_3$, $Fe(No_3)_2$, $KMnO_4$, $KNO_3$ $HNO_3$, bromate, Bromine, Butadiene, Chlorates, Chloric acid, Chlorine, Chlorites, Chromates, Chromic Acid, Dichromates, Fluorine, haloates, Halogens, hypochlorites, Nitrous oxide, Ozanates, oxides, oxygen, oxygen difluoride ozone, peracetic acid perborates, perhaloate, percarbonates, perchlorates, perchloric acid, perhydrates, peroxides, persulfates, permanganates, sodium borate and sulfuric acid.

15. The method of claim 4, wherein the CMP slurry comprises an enzyme.

16. The method of claim 1, wherein chemishearing the surface comprises micro-cracking the surface.

17. A method for polishing a semiconductor substrate having a polymer film surface deposited thereon, comprising:
    chemishearing the surface; and
    performing chemical mechanical polishing (CMP) on the chemisheared surface, wherein performing the CMP further comprises:
    Removal rate: 2000–5000 A/min.
    Down force: no less than 1 psi
    Turntable rotation speed: no less than 50 rpm.
    Head speed no less than 30 rpm.
    Conditioner: in situ or ex situ.
    Pad: polyurethane pad.

18. The method of claim 17, wherein the CMP slurry comprises an enzyme.

19. The method of claim 17, wherein chemishearing the surface comprises one of: oxidizing, catalyzing, and local pyrogenating the surface.

20. The method of claim 17, comprising applying a polymer CMP slurry.

* * * * *